US006422836B1

(12) United States Patent
Krueger et al.

(10) Patent No.: US 6,422,836 B1
(45) Date of Patent: Jul. 23, 2002

(54) BI-DIRECTIONALLY DRIVEN RECIPROCATING FLUID PUMP

(75) Inventors: William R. Krueger, New Berlin; Dale S. Yakel, Waukesha, both of WI (US)

(73) Assignee: Bombardier Motor Corporation of America, Grant, FL (US)

( * ) Notice: Subject to any disclaimer, the term of this patent is extended or adjusted under 35 U.S.C. 154(b) by 0 days.

(21) Appl. No.: 09/540,818

(22) Filed: Mar. 31, 2000

(51) Int. Cl.[7] .......................... F04B 17/04; F04B 17/00; H01L 41/04

(52) U.S. Cl. ........................ 417/418; 417/366; 310/314

(58) Field of Search ................................ 417/418, 417, 417/366, 554, 549; 310/314

(56) References Cited

U.S. PATENT DOCUMENTS 3,282,219 A * 11/1966 Blackwell et al. .......... 417/418
3,791,770 A * 2/1974 Farkos ....................... 417/418
3,894,817 A * 7/1975 Majoros et al. ............. 417/415
4,252,505 A * 2/1981 Toyoda ....................... 417/417
5,085,563 A * 2/1992 Collins et al. .............. 417/417
5,518,372 A * 5/1996 Chin .......................... 417/417

* cited by examiner

*Primary Examiner*—Charles G. Freay
*Assistant Examiner*—Michael K. Gray
(74) *Attorney, Agent, or Firm*—Fletcher, Yoder & Van Someran

(57) ABSTRACT

A reciprocating fluid pump includes a drive section and a pump section. The drive section has a pair of coils which may be energized to cause displacement of a reciprocating assembly. Each coil is a reluctance gap arrangement in which a magnetic circuit is interrupted by a gap towards which an armature of the reciprocating assembly is drawn when energizing current is applied to the coil. The reciprocating assembly includes an element which is extended into and retracted from a pump chamber during its reciprocating motion, causing fluid to be drawn into and expelled from the pump chamber. The pump is particularly well suited for use in cyclic pumping applications, such as internal combustion engine fuel injection. Cycle times in such applications may be reduced by appropriate control of the current waveforms applied to the coils.

30 Claims, 4 Drawing Sheets

BI-DIRECTIONALLY DRIVEN RECIPROCATING FLUID PUMP

BACKGROUND OF THE INVENTION

1. Field of the Invention

The present invention relates generally to the field of reciprocating pumps, and more particularly to a bi-directionally driven reciprocating pump which is driven by energization of solenoid coils and is particularly well suited to pumping fluids such as fuel in injection systems.

2. Description of the Related Art

A wide variety of pump designs and styles have been devised and are presently in use. In general, pumps are based upon the principal that fluid can be drawn into a pumping volume under a first pressure, and expelled from the pumping volume under a higher pressure to displace the fluids are desired. Depending upon the specific application envisaged, pumps are typically selected as a function of their displacement, cycling characteristics, pressure ratings, size, and so forth. Moreover, pumps are typically classified by their general nature, such as reciprocating or rotary, and by the nature of their driver, typically being designed to be electrically driven, or otherwise.

Specific pumps have been developed for demanding reciprocating applications such as fuel injection. In one design for this application, a reciprocating assembly, including an armature and a guide tube, are driven by energization of an electric solenoid. As the reciprocating assembly is moved into and out of a pump section, fluid is drawn into the pump section, and expelled therefrom under a higher pressure. The energization of the solenoid controls the pumping cycle, with the return stroke of the reciprocating assembly resulting from a spring bias of the reciprocating assembly toward a retracted position. Pumps of this type have been applied in combustion engine fuel injection systems due to their high performance and efficiency, their inherent electrical controllability, and to their reduced size.

While applications such as fuel injection have benefited from reciprocating pumps of the type described above, their continues to be a need for improved pumps for this and similar applications. For example, to serve high performance internal combustion engines, reciprocating fuel injection pumps require increasingly short cycle times and may benefit from additional flexibility in the control of the position and velocity of a reciprocating assembly. For example, if a pump assembly in an electrically driven reciprocating fuel pump could be cycled more rapidly, the engine designer could provide for increased flow rate of fuel into combustion chambers, as well as greater controllability of the quantity of fuel injected per stroke. This enhanced flexibility would permit for greater control and servicing of higher torque and higher horsepower engines. Even conventional engines could benefit from enhanced controllability of such pumps, and shortened cycle times.

There is a particular need, at present, for improved pumping techniques which can make use of electrical control signals to regulate the position and velocity of a reciprocating pumping assembly. This need is particularly felt in the area of fuel injection, where a pumping assembly may be directly secured to a pump driving assembly which receives the electrical control signals. In direct in-chamber injection applications, the resulting assembly may be affixed to one or more injection nozzles to provide a compact, high performance pump and injector system.

SUMMARY OF THE INVENTION

The present invention provides a bi-directionally driven reciprocating fluid pump technique designed to respond to these needs. The pump may be employed in a wide variety of applications, particularly in applications in which high-speed reciprocation is desired, with relatively low volumetric flow rates. The present technique is particularly well suited to fuel injection systems, in which a fuel is drawn into a pumping assembly from a source, pressurized in the pumping assembly, and injected for combustion in a combustion chamber, such as directly into a cylinder of an engine.

The technique of the invention makes use of a pair of reluctance gap coil arrangements within a drive section of a pump. Each coil can be energized to draw an armature of a reciprocating assembly towards a reluctance gap. The reciprocating assembly may be biased into a centered or normal position by springs. A guide tube acts as a pump plunger, and is reciprocally driven by cyclic energization of the coils. Fluid is drawn into a pump chamber as the guide tube is retracted from the pump chamber, and is pressurized and expressed from the pump chamber as the guide tube is extended into the pump chamber. Control signals to the coils may be timed and shaped to provide reduced cycle times and to vary volumetric flow rates from the pump, as well as to vary volumetric displacement per pump cycle.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
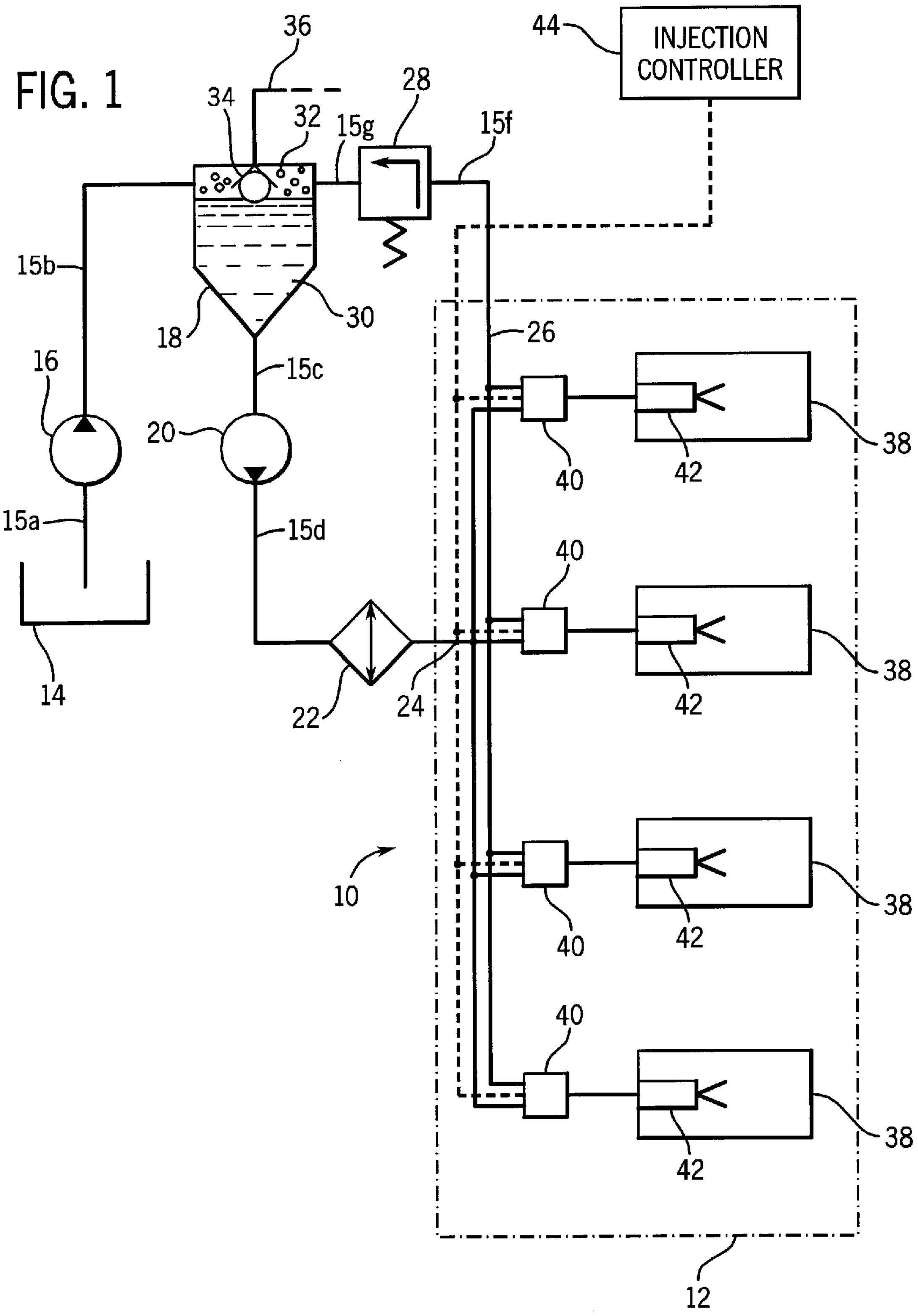
FIG. 1 is a diagrammatical representation of a series of fluid pump assemblies applied to inject fuel into an internal combustion engine.

Turning now to the drawings and referring first to FIG. 1, a fuel injection system 10 is illustrated diagrammatically, including a series of pumps for displacing fuel under pressure in an internal combustion engine 12. While the fluid pumps of the present technique may be employed in a wide variety of settings, they are particularly well suited to fuel injection systems in which relatively small quantities of fuel are pressurized cyclically to inject the fuel into combustion chambers of an engine as a function of the engine demands. The pumps may be employed with individual combustion chambers as in the illustrated embodiment, or may be associated in various ways to pressurize quantities of fuel, as in a fuel rail, feed manifold, and so forth. Even more generally, the present pumping technique may be employed in settings other than fuel injection, such as for displacing fluids under pressure in response to electrical control signals used to energize coils of a drive assembly, as described below.

In the embodiment shown in FIG. 1, the fuel injection system 10 includes a fuel reservoir 14, such as a tank for containing a reserve of liquid fuel. A first pump 16 draws the fuel from the reservoir, and delivers the fuel to a separator 18. While the system may function adequately without a separator 18, in the illustrated embodiment, separator 18 serves to insure that the fuel injection system downstream receives liquid fuel, as opposed to mixed phase fuel. A second pump 20 draws the liquid fuel from separator 18 and delivers the fuel, through a cooler 22, to a feed or inlet manifold 24. Cooler 22 may be any suitable type of fluid cooler, including both air and liquid heater exchangers, radiators, and so forth.

Fuel from the feed manifold 24 is available for injection into combustion chambers of engine 12, as described more fully below. A return manifold 26 is provided for recirculating fluid not injected into the combustion chambers of the engine. In the illustrated embodiment a pressure regulating valve 28 is placed in series in the return manifold line 26 for maintaining a desired pressure within the return manifold. Fluid returned via the pressure regulating valve 28 is recirculated into the separator 18 where the fuel collects in liquid phase as illustrated at reference numeral 30. Gaseous phase components of the fuel, designated by referenced numeral 32 in FIG. 1, may rise from the fuel surface and, depending upon the level of liquid fuel within the separator, may be allowed to escape via a float valve 34. A vent 36 is provided for permitting the escape of gaseous components, such as for repressurization, recirculation, and so forth.

Engine 12 includes a series of combustion chambers or cylinders 38 for driving an output shaft (not shown) in rotation. As will be appreciated by those skilled in the art, depending upon the engine design, pistons (not shown) are driven in a reciprocating fashion within each combustion chamber in response to ignition of fuel within the combustion chamber. The stroke of the piston within the chamber will permit fresh air for subsequent combustion cycles to be admitted into the chamber, while scavenging combustion products from the chamber. While the present embodiment employs a straightforward two-stroke engine design, the pumps in accordance with the present technique may be adapted for a wide variety of applications and engine designs, including other than two-stroke engines and cycles.

In the illustrated embodiment, a reciprocating pump 40 is associated with each combustion chamber, drawing pressurized fuel from the feed manifold 24, and further pressurizing the fuel for injection into the respective combustion chamber. A nozzle 42 is provided for atomizing the pressurized fuel downstream of each reciprocating pump 40. While the present technique is not intended to be limited to any particular injection system or injection scheme, in the illustrated embodiment a pressure pulse created in the liquid fuel forces a fuel spray to be formed at the mouth or outlet of the nozzle, for direct, in-cylinder injection. The operation of reciprocating pumps 40 is controlled by an injection controller 44. Injection controller 44, which will typically include a programmed microprocessor or other digital processing circuitry, and memory for storing a routine employed in providing control signals to the pumps, applies energizing signals to the pumps to cause their reciprocation in any one of a wide variety of manners as described more fully below.

Figure 2:
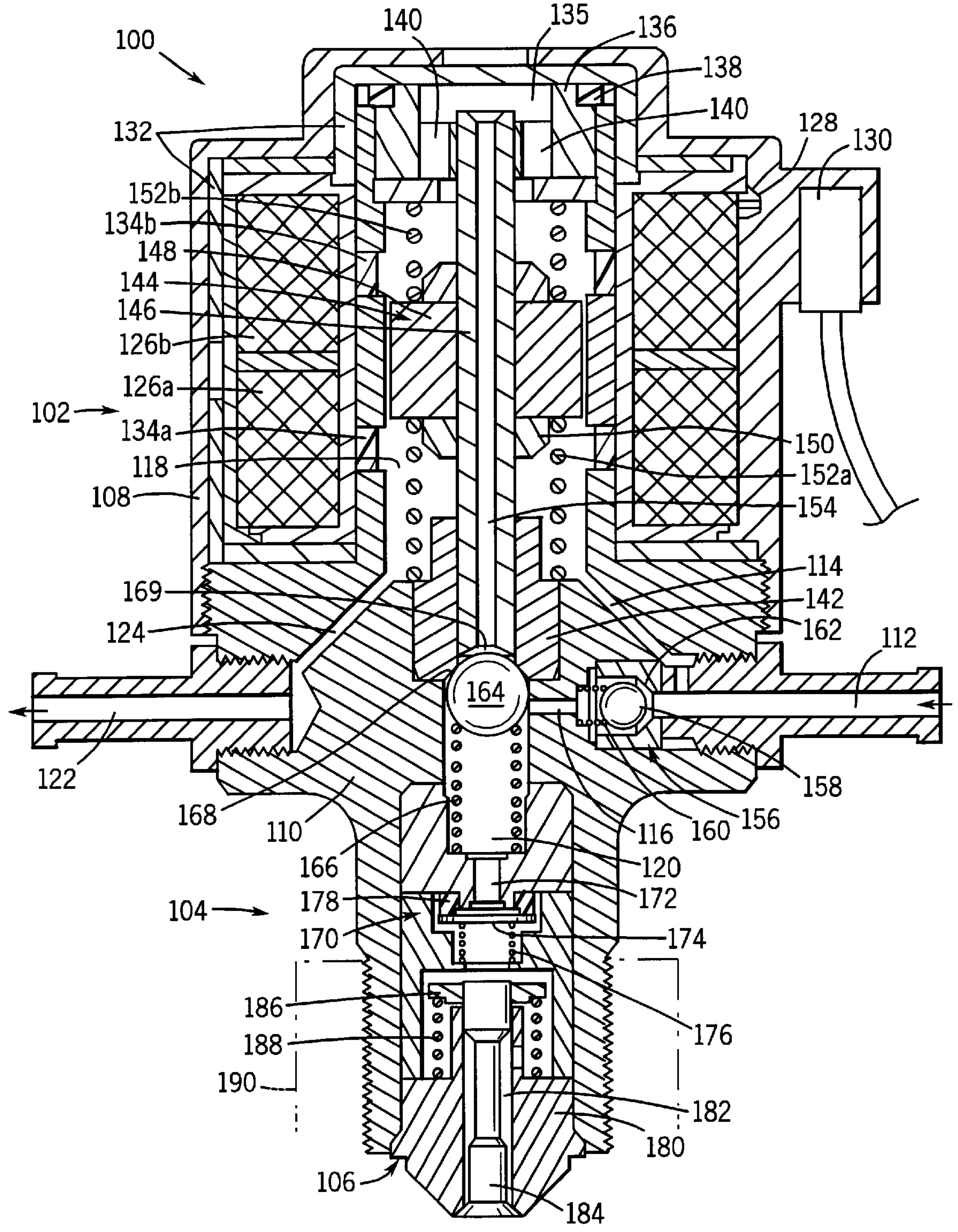
FIG. 2 is a partial sectional view of an exemplary pump in accordance with aspects of the present technique for use in displacing fuel under pressure, such as for direct injection into a chamber of an internal combustion engine.
Figure 3:
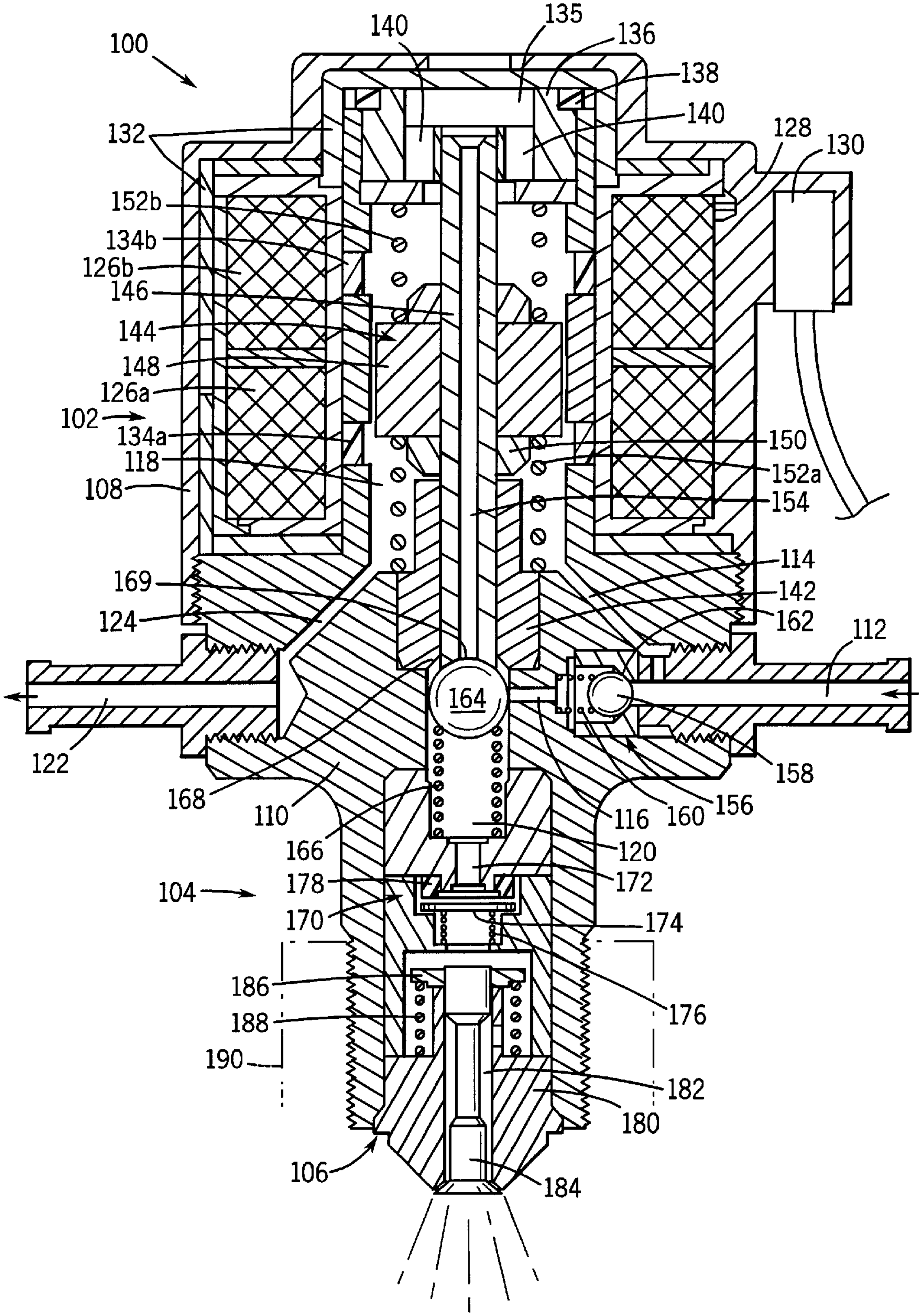
FIG. 3 is a partial sectional view of the pump illustrated in FIG. 2 energized to pressurize fuel for injection.

An exemplary reciprocating pump assembly, such as for use in a fuel injection system of the type illustrated in FIG. 1, is shown in FIGS. 2 and 3. Specifically, FIG. 2 illustrates the internal components of a pump assembly including a drive section and a pumping section in a first position wherein fuel is introduced into the pump for pressurization. FIG. 3 illustrates the same pump following energization of a solenoid coil to drive a reciprocating assembly and thus cause pressurization of the fuel and its expulsion from the pump. It should be borne in mind that the particular configurations illustrated in FIGS. 2 and 3 are intended to be exemplary only. Other variations on the pump may be envisaged, particularly variants on the components used to pressurize the fluid and to deliver the fluid to a downstream application.

The pump of FIGS. 2 and 3 includes a novel arrangement for driving a reciprocating assembly. In particular, as opposed to heretofore known reciprocating pumps, the arrangement illustrated in the Figures provides for two separate reluctance gaps in an electromagnetic drive assembly. As described below, solenoids of the assembly can be selectively energized to draw an armature of the reciprocating assembly in opposite directions, thereby permitting enhanced functionality. This enhanced functionality may include the shaping of velocity profiles of the reciprocating assembly, shortening of cycle times of the pump, positioning the reciprocating assembly at desired positional offsets from a central or biased position, and so forth.

In the embodiment of FIG. 2, a pump and nozzle assembly, designated generally by the reference numeral 100, includes a drive section 102, a pump section 104, and a nozzle assembly 106. The drive section 102 serves to force reciprocating displacement of a reciprocating assembly of the pump section 104. The nozzle assembly 106 serves to receive pressurized fuel from the pump assembly and to inject it into a combustion chamber of an internal combustion engine, as described above with reference to FIG. 1. A drive section housing 108 is provided around the drive section 102 for containing the internal components of the drive section, and for permitting preassembly of certain of these components. A pump housing 110 similarly receives the components of the pump section, and is designed to interface with the drive section housing 108 in a sealed manner.

An inlet 112 serves to receive fluid for displacement by the pump, such as from a feed manifold 24 as shown in FIG. 1. A flow passage 114 diverts a portion of fluid from the inlet 112, while a pump feed passage 116 directs fluid from the inlet into the pump section. Specifically, fluid from inlet 112 passing through passage 114 is introduced into armature chamber 118 for cooling the drive section during operation. Fluid passing through pump feed passage 116 is introduced into a pump chamber 120 where the fluid is pressurized and expelled during operation of the pump. An outlet 122 returns fluid which is not pressurized by the pump to a return line, such as return manifold 26 shown in FIG. 1. Thus, fluid entering into the armature chamber 118 may be free to recirculate through a passage 124 which connects the armature chamber to outlet 122.

Drive section 102 includes a pair of wound coils **126*a* and 126*b* which receive energizing current through leads 128. In the illustrated embodiment, leads 128 are coupled to external circuitry, such as the injection controller 44 shown in FIG. 1, via a plug or receptacle 130. The coils 126*a* and 126*b* are partially surrounded by a series of magnetic flux-conducting members which form a magnetic circuit around each coil in an annular fashion, interrupted by a reluctance gap. These magnetic flux-conducting members, designated generally by the reference numeral 132 in FIG. 2, may be made of any suitable material, such as a ferromagnetic metal, copper and copper alloys, and so forth. Reluctance gap spacers 134*a* and 134*b*, in the form of essentially non-conductive annular members provide an annular gap in the vicinity of a central portion of each coil 126*a* and 126*b***, respectively. As will be appreciated by those skilled in the art, upon energization of one or both of the coils, current through the coils results in creation of an electromagnetic field about the coils. This electromagnetic field is conveyed and channeled by the magnetic members partially surrounding the coils. However, the magnetic field is interrupted by the reluctance gap spacers, causing displacement of the reciprocating assembly as described below.

In the illustrated embodiment, a cushioning reservoir 135 is provided at an upper end of the drive section 102. A series of annular bushings or spacers 136 and 138 serve to define the cushioning reservoir, as well as to define flow passages 140 which, as described below, provide some degree of cushioning action of a reciprocating assembly during its movement within the drive section housing. A lower bushing 142 similarly seals a lower region of the drive section with respect to the pump section. Bushings 136 and 142 also serve to guide a reciprocating assembly 144 in motion during operation of the pump.

In the illustrated embodiment, reciprocating assembly 144 includes a guide tube 146 secured to an armature 148. The armature, which is preferably made of a ferromagnetic or other magnetic flux-conducting material, is influenced by the fields generated by coils 126*a* and 126*b* during operation, being drawn towards one or both of the reluctance gaps defined by the reluctance gap spacers 134*a* and 134*b*. As the armature is thus drawn towards one of the reluctance gaps, the guide tube 146 is similarly displaced to cause the desired pumping action. Centering abutments 150 are provided on either side of the armature for centering biasing springs 152*a* and 152*b*. While in certain embodiments, the biasing may be performed by current applied to one or both of the coils, in the illustrated embodiment, springs 152*a* and 152*b* serve to maintain the armature and guide tube in a centered position.

In the embodiment illustrated in FIG. 2, a central passage 154 is provided through guide tube 146 for permitting the flow of fuel therethrough. During operation, passage 154 will fill with fluid, enabling the free displacement of the reciprocating assembly during an initial phase of each pumping cycle.

An inlet check valve assembly 156 is provided between inlet 112 and the pump chamber 120 for regulating the introduction of fuel into the pump chamber and for preventing fluid from being expelled from the pump chamber into the inlet during operation. In the illustrated embodiment, inlet check valve assembly 156 thus includes a valve ball 158 and a biasing spring 160 which urges the ball toward a seat 162. When the fluid within the pump chamber 120 is not compressed during a pumping cycle, the pressure of the fluid at inlet 112 is sufficient to unseat ball 158 from its seat, to provide fuel flow into the pump chamber. As described below, during a pumping cycle, the pressure is overcome, causing the ball to seat within the inlet check valve assembly, restricting the flow of fluid from the pump chamber out through the inlet.

Within pump chamber 120, a flow control member in the form of a ball 164 is provided. Ball 164 is urged toward the reciprocating assembly by a biasing spring 166, and is prevented from contacting a lower extremity of the guide tube by an abutment 168. In the illustrated embodiment, the lower extremity of the guide tube is preferably removed from ball 164 in the retracted position, as illustrated by the gap or space 169.

An outlet check valve assembly 170 serves to permit the expulsion of pressurized fluid from pump chamber 120 during operation. In the illustrated embodiment, outlet check valve assembly 170 includes an outlet passage 172 and fluid communication with pump chamber 120. An outlet check valve disk 174 is urged upwardly toward the outlet passage 172 by a biasing spring 176, and sealingly seats against a soft seat member 178. As described below, fluid pressurized during operation of the pump may be expelled by forcing disk 174 from its seat against the force of spring 176.

As noted above, the pump of FIG. 2 may be employed in a wide variety of settings. In the illustrated embodiment, however, the pump is directly coupled to a nozzle body 180 which is secured within the pump section housing 110. Alternatively, the nozzle may be provided at some distance from the pump housing, or may be provided in tap lines from a manifold fed by the pump assembly. In the illustrated embodiment, a passage 182 is provided through the nozzle body 180 for channeling pressurized fluid through the body. A poppet 184 is positioned within passage 182 and is sealed at a mouth of the nozzle body. A retainer 186 is fitted to an upper end of poppet 184 and acts as an abutment of a compression spring 188 used to maintain the poppet in seated engagement at the mouth of the nozzle body. The entire nozzle assembly may be positioned in a cylinder head, as indicated at broken line 190, for direct, in-cylinder fuel injection.

FIG. 3 illustrates the components of the pump and nozzle assembly of FIG. 2 following energization of lower solenoid coil 126*a*. When coil 126*a* is energized, armature 148 is drawn towards the reluctance gap defined by reluctance gap spacer 134*a* by virtue of the magnetic field which is established around the coil but interrupted by the reluctance gap spacer. During initial phase of motion, the reciprocating assembly 144 is relatively free to accelerate and gain momentum before contacting ball 164. Upon contacting ball 164, guide tube 146 seats against the ball, beginning pressurization of fluid within chamber 120. This increase in pressure causes the inlet check valve ball 158 to seat, and further displacement of the reciprocating assembly and ball 164 compresses biasing spring 166, causing a pressure surge within the pump chamber 120. As pressure increases within pump chamber 120, outlet check valve disk 174 is unseated, enabling fluid to flow from the pump chamber 120 out through passage 172 and into the nozzle assembly. This pressure surge then forces displacement of poppet 184 against the force of biasing spring 188, allowing fuel to be ejected through a passage established between the poppet and the nozzle body.

As current is removed or altered in coil 126*a*, the velocity of the reciprocating assembly will similarly be altered. For example, if current is fully removed from the coil, biasing spring 152*a*, assisted at least partially by spring 166, will force the return of the reciprocating assembly to its biased or centered position. However, in the present technique, the reciprocating assembly may be forced to return more quickly to an initial position by energization of coil 126*b*. Specifically, timing of energization of the coils may be implemented such that the magnetic field offered around coil 126*a* is eliminated, while a magnetic field around coil 126*b* is established. This later magnetic field will draw the reciprocating assembly toward the reluctance gap established by reluctance gap spacer 134*b*. Once the reciprocating assembly has returned to its initial position, as illustrated in FIG. 2, another cycle of reciprocating pumping motion may be initiated.

As will be appreciated by those skilled in the art, the foregoing structure and technique permit a wide range of adjustments in the performance of the pump. For example, as noted above, the reciprocating assembly may be driven back to its initial position by energization of the second reluctance gap coil 126*b*, thereby substantially shortening the cycle time of the device as compared to heretofore known reciprocating pump assemblies including only spring-return operation. Moreover, by energizing coil 126*b* during a desired portion of the stroke of the reciprocating assembly, the velocity of the reciprocating assembly may be adjusted, such as to provide for improved or shaped pump pulses. Similarly, shaped pulses applied to one of both coils at the proper time can minimize spring bounce. At the end of a pump cycle, for example, these pulses can provide variable damping which brings the armature 144 to a rapid stop without bouncing, thus decreasing cycle time. Also, one or both of the coil assemblies may be energized to provide for desired offsets in the retracted or extended position of the reciprocating assembly. By way of example, where additional fuel displacement is desired, coil 126*b* may be energized during the retraction portion of the cycle, to draw more fluid into the pump chamber 120, as compared to the quantity of fluid drawn into the chamber during a normal cycle wherein the assembly is simply returned to a centered position.

Figure 4:
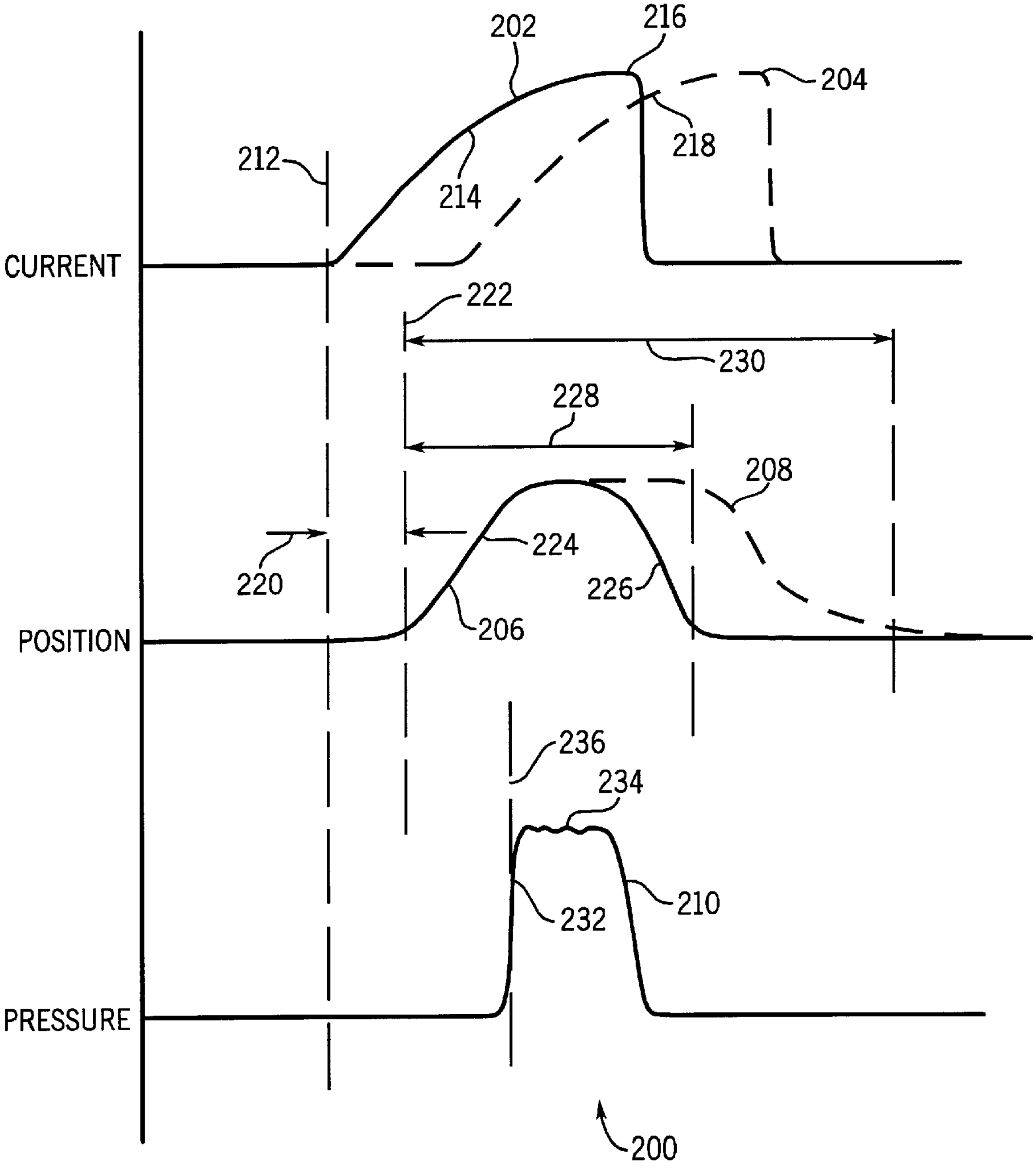
FIG. 4 is a graphical representation of a sequence of energizing signals applied to the pump of FIGS. 2 and 3 for displacing a reciprocating assembly and pumping fuel.

FIG. 4 illustrates graphically a typical pump cycle obtainable through the structure and technique described above. In particular, FIG. 4 illustrates a pumping cycle, designated generally by reference numeral 200. In this pumping cycle, current is applied to coils 126*a* and 126*b*, as indicated by traces 202 and 204, respectively. The position of the reciprocating assembly as influenced by this energization may be illustrated graphically by a trace as indicated at reference numeral 206. FIG. 4 also illustrates a comparable trace 208 which would be typical for a spring-returned reluctance gap pump assembly. As a result of the displacement of the reciprocating assembly, a pressure surge is created as indicated by trace 210 in FIG. 4.

Considering the traces of FIG. 4 in somewhat greater detail, at an initiation time 212, energization of coil 126*a* is initiated, such as by control signals applied by an injection controller 44, as shown in FIG. 1. The waveform of the current applied to the coil may have any desired shape, such as the gradually sloping shape of the trace in FIG. 4, with current initially increasing at a relatively high rate, followed by a gradually reduced rate of increase, as indicated at reference numeral 214. This current reaches a maximum at point 216, generally corresponding to the end of the pumping cycle in the illustrated embodiment. As indicated at trace 204, coil 126*b* may also be energized in a similar fashion, with a gradually increasing slope, as indicated by reference numeral 218. The energization of coil 126*b* is begun at a time displaced from the initiation time of energization of coil 126*a*, to provide force for retraction of the reciprocating assembly at an appropriate stage in the pumping cycle.

The position of the reciprocating assembly will be altered by the forces applied to the assembly during energization of one or both of the coils. In the position trace of FIG. 4, initial displacement of the reciprocating assembly begins at some time 220 after initial energization of coil 126*a*. This initial period may be reduced, where desired, by appropriately altering the shape of the current applied to coil 126*a*. The reciprocating assembly then moves toward its fully extended position shown in FIG. 3, following a leading edge 124 of the position trace. Upon release of the current from coil 126*a*, or upon an appropriate balance of forces resulting from current applied to both coils 126*a* and 126*b*, the reciprocating assembly will be returned to its initial position as indicated by trailing edge 226 of the position trace. The resulting cycle time 228 may be substantially reduced, as compared to spring-returned structures.

As will be appreciated by those skilled in the art, following initial displacement of the reciprocating assembly, and sealing engagement between the guide tube and the flow control member, a pressure spike will be created having a sharp leading edge 232, followed by a relatively flat plateau 234.

The control of energizing waveforms applied to the coils offers additional advantages as compared to conventional single-coil devices. For example, where a single coil is employed for a reciprocating drive, inductive rise times encountered during application of current to a solenoid coil result in additional delay in movement of the reciprocating armature and associated components. Such rise times further lengthen the cycle times available in the devices. The foregoing structure and technique, however, permit reductions in the inductive rise times, where desired, by permitting control signals to be applied to both coils during at least partially overlapping intervals. Release of one coil (i.e. interruption of current to the coil), then permits rapid displacement of the armature in the direction of the other coil.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A reciprocating fuel pump comprising:

a housing assembly;

a bi-directional reluctance motor, comprising:

- a first generally annular solenoid coil;
- a second generally annular solenoid coil disposed adjacent to and coaxial with the first coil;
- an armature disposed coaxially with the first and second solenoid coils and movable axially bidirectionally by energization of the first and second coils; and
- a magnetic flux conducting member disposed coaxially between the first and second solenoid coils and the armature and having first and second reluctance gaps; and a pump assembly, comprising:

- a pump member secured to the armature, the pump assembly being operative to pump fluid into and out of the fuel pump in response to reciprocating movement of the armature.

2. The pump of claim 1, wherein the armature is drawn toward the first reluctance gap during energization of the first solenoid coil and is drawn toward the second reluctance gap during energization of the second solenoid coil.

3. The pump of claim 2, comprising a magnetic circuit at least partially defined by the housing assembly.

4. The pump of claim 1, wherein the pump member comprises a tubular member secured to the armature.

5. The pump of claim 1, wherein the pump section includes an inlet check valve and an outlet check valve, and wherein the inlet and outlet check valves are actuated by pressures created in the pump section during reciprocation of the pump member.

6. The pump of claim 1, wherein the armature is disposed radially within a space defined by the first and second coils.

7. The pump of claim 1, wherein the armature is biased towards an initial position with respect to the first and second coils.

8. A linearly reciprocating pump comprising:

a housing having a solenoid section and a pump section;

first and second reluctance gap assemblies, comprising:

first and second coils disposed coaxially within the solenoid section; and a magnetic flux conducting member having first and second reluctance gaps corresponding to the first and second coils, respectively; and a reciprocating assembly including an armature and a pump member, the armature being disposed coaxially with the first and second coils within the solenoid section, the pump member being secured to and movable with the armature into and out of the pump section to pump fluid during reciprocating movement of the armature;

wherein the first and second coils are energizable to drive the reciprocating assembly bidirectionally.

9. The pump of claim 8, wherein the first and second coils are disposed adjacent to one another at a first end of the housing opposite from the pump section.

10. The pump of claim 8, wherein each reluctance gap at least partially surrounds the coil.

11. The pump of claim 8, wherein the reluctance gaps are disposed at predetermined maximum stroke locations towards which the armature is drawn during energization of the respective coil.

12. The pump of claim 8, wherein the pump section includes inlet and outlet check valves actuated by pressure within the pump section produced by movement of the pump member within the pump section.

13. The pump of claim 8, wherein the pump member includes a tubular shaft and wherein the pump section includes a sealing member contacting the tubular shaft during a pumping stroke of the reciprocating assembly to seal a central passage of the tubular shaft.

14. The pump of claim 8, wherein the solenoid section is cooled by fluid circulated from an inlet to the pump section to a bypass outlet.

15. The pump of claim 8, further comprising a nozzle assembly secured to the pump section for ejecting fluid pumped during reciprocation of the reciprocating assembly.

16. A reciprocating fuel pump comprising:

a housing having a solenoid section and a pump section;

first and second solenoid coils disposed coaxially within the solenoid section;

a reciprocating assembly including an armature and a pump member, the armature being disposed coaxially with the first and second coils within the solenoid section, the pump member being secured to and movable with the armature into and out of the pump section to pump fuel during reciprocating movement of the armature; and a nozzle assembly in fluid communication with the pump section, the nozzle assembly being configured to open and close to inject and to interrupt injection of fuel into a combustion chamber in response to pressures created by reciprocation of the reciprocating assembly.

17. The pump of claim 16, wherein the first and second solenoid coils each includes a magnetic circuit at least partially surrounding the respective coil, and wherein the magnetic circuit is interrupted by a gap towards which the armature is drawn during energization of the respective coil.

18. The pump of claim 17, wherein the gaps of the first and second coils are disposed at predetermined maximum stroke locations towards which the armature is drawn during energization of the respective coil.

19. The pump of claim 16, wherein the first and second coils are disposed adjacent to one another at a first end of the housing, and the nozzle is disposed at a second end of the housing opposite the first.

20. The pump of claim 16, wherein the pump section includes inlet and outlet check valves actuated by pressure within the pump section produced by movement of the pump member within the pump section.

21. The pump of claim 16, wherein the pump member includes a tubular shaft and wherein the pump section includes a sealing member contacting the tubular shaft during a pumping stroke of the reciprocating assembly to seal a central passage of the tubular shaft.

22. The pump of claim 16, wherein the solenoid section is cooled by fluid circulated from an inlet to the pump section to a bypass outlet.

23. A method for pumping fluid with a reciprocating pump driven by a reluctance motor assembly including first and second coaxial coils and a reciprocating assembly disposed coaxially with respect to the coils and extending into a pump section, the method comprising the steps of:

energizing the first coil to drive the reciprocating assembly toward a first reluctance gap in a first direction and thereby to increase pressure in the pump section to eject fluid therefrom; and energizing the second coil to drive the reciprocating assembly toward a second reluctance gap in a second direction opposite from the first direction to reduce pressure in the pump section to draw fluid into the pump section for a subsequent cycle of the pump.

24. The method of claim 23, wherein the coils are energized for a time corresponding to a desired displacement of the reciprocating assembly towards the respective reluctance gaps.

25. The method of claim 23, wherein the reciprocating assembly is biased towards an initial position between the first and second coils.

26. The method of claim 23, wherein energization of the first coil drives a pump member of the reciprocating assembly into the pump section to produce the increase in pressure in the pump section.

27. The method of claim 26, including the steps of closing an inlet valve and opening an outlet valve in response to the increase in pressure within the pump section.

28. The method of claim 26, including the steps of closing an outlet valve and opening an inlet valve in response to the reduction in pressure within the pump section.

29. The method of claim 26, including the step of cycling a nozzle assembly in fluid communication with the pump section to eject fluid therefrom in response to the increase in pressure in the pump section.

30. The method of claim 26, wherein the first and second coils are energized at times at least partially overlapping with one another.

* * * * *